United States Patent
Chan et al.

(10) Patent No.: US 8,102,188 B1
(45) Date of Patent: Jan. 24, 2012

(54) METHOD OF AND SYSTEM FOR IMPLEMENTING A CIRCUIT IN A DEVICE HAVING PROGRAMMABLE LOGIC

(75) Inventors: Chi Bun Chan, San Jose, CA (US); Nabeel Shirazi, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 125 days.

(21) Appl. No.: 12/757,770

(22) Filed: Apr. 9, 2010

Related U.S. Application Data

(62) Division of application No. 12/008,489, filed on Jan. 11, 2008, now Pat. No. 7,746,099.

(51) Int. Cl.
 *H03K 19/173* (2006.01)
(52) U.S. Cl. .......................................... 326/38
(58) Field of Classification Search ............... 326/37–41, 326/47, 101
 See application file for complete search history.

(56) References Cited

U.S. PATENT DOCUMENTS

| | | | | |
|---|---|---|---|---|
| 6,057,704 A | * | 5/2000 | New et al. | 326/38 |
| 7,093,225 B2 | * | 8/2006 | Osann, Jr. | 438/129 |
| 7,233,532 B2 | * | 6/2007 | Vadi et al. | 365/189.12 |
| 2004/0034843 A1 | * | 2/2004 | Osann, Jr. | 716/16 |
| 2005/0242835 A1 | * | 11/2005 | Vadi et al. | 326/37 |
| 2005/0248364 A1 | * | 11/2005 | Vadi et al. | 326/39 |
| 2006/0248493 A1 | * | 11/2006 | Osann, Jr. | 716/16 |
| 2008/0244506 A1 | * | 10/2008 | Killian et al. | 717/100 |
| 2008/0278197 A1 | * | 11/2008 | Murotake | 326/38 |
| 2009/0044165 A9 | * | 2/2009 | Osann, Jr. | 716/16 |

OTHER PUBLICATIONS

U.S. Appl. No. 12/008,489, filed Jan. 11, 2008, Chan et al.

* cited by examiner

*Primary Examiner* — Shawki S Ismail
*Assistant Examiner* — Thienvu Tran
(74) *Attorney, Agent, or Firm* — John J. King; Lois D. Cartier

(57) ABSTRACT

A method of implementing a circuit in a device having programmable resources and a predetermined amount of available internal memory is disclosed. The method comprises configuring the programmable resources of the device with a circuit design; storing a first page of data in a block of random access memory; determining a page fault while interfacing with the block of random access memory when implementing the circuit design; performing a partial reconfiguration of the device, wherein a second page of data is stored in the block of random access memory; and accessing the second page of data. A system of implementing a circuit in a device having programmable logic is also disclosed.

8 Claims, 7 Drawing Sheets

METHOD OF AND SYSTEM FOR IMPLEMENTING A CIRCUIT IN A DEVICE HAVING PROGRAMMABLE LOGIC

FIELD OF THE INVENTION

The present invention relates generally to integrated circuits, and in particular, to a method of and system for implementing a circuit in a device having programmable logic.

BACKGROUND

A programmable logic device is designed to be user programmable so that users may implement logic designs of their choices. One type of programmable logic device is the Complex Programmable Logic Device (CPLD). A CPLD includes two or more "function blocks" having a two-level AND/OR structure connected together and to input/output (I/O) resources by an interconnect switch matrix. Another type of programmable logic device is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., FLASH memory, as in some CPLDs), or in any other type of memory cell.

PLDs also have different "modes" depending on the operations being performed on them. A specific protocol allows a programmable logic device to enter into the appropriate mode. Typical PLDs have internal blocks of configuration memory which specify how each of the programmable cells will emulate the user's logic. During a "program" mode, a configuration bitstream is provided to non-volatile memory, such as a read-only memory (ROM) (e.g. a programmable ROM (PROM), an erasable PROM (EPROM), or an electrically erasable PROM (EEPROM)) either external or internal to the programmable logic device. Each address is typically accessed by specifying its row and column addresses. During system power up of a "startup" mode, the configuration bits are successively loaded from the non-volatile memory into static random access memory (SRAM) configuration latches of a configuration logic block.

In addition to configuration memory, PLDs typically include other on-chip memory such as blocks of random access memory available for users to implement their designs. Memory is a common building block in many applications such as signal processing, filter designs, video processing, packet queuing and processing systems. Some of these applications require a large amount of memory. However, the amount of available memory on a PLD for implementing user designs beyond the memory required to enable the operation of the PLD may be limited. When implementing an application on a PLD, on-chip memory and off-chip memory are generally considered for use with the application. While a user of a PLD may use both on-chip memory and off-chip memory, there are a number of problems that a user may encounter when using either of these types of memories.

On-chip memories on a PLD are relatively small in size and considered as a dedicated and expensive resource. Low-end PLDs or PLDs in a small package could have a very limited amount of memory. In some scenarios, there may be some constraint on timing or routing of interconnects that prevents the full utilization of available on-chip memories. While off-chip memories may be used to supplement the on-chip memories, off-chip memories may not be available on every platform, and the memory size may be fixed or not easily extended. The architecture and available amount of on-chip memories vary across PLDs based on the device family and packaging. The timing/routing constraint affecting the amount of usable memory varies not only with devices, but also with designs. Similar problems exist when using off-chip memories. For instance, some platforms have a fixed, on-board, dual in-line memory module (DIMM) with a simple zero bit turnaround (ZBT) memory interface, while some have a complicated double data rate 2 (DDR2) interface that supports external DIMMs. Interfacing with off-chip memories such as DDR2 may be challenging. A memory controller is often needed to use off-chip memories, and different memory standards may require different controllers. The control and timing to perform a memory access may also vary across different standards.

The limitations in memory size and the variations of memory resources across platforms described above may further impact the user flexibility of a design to be implemented by a user. For example, a design for a PLD platform may need to be modified before it may be migrated to another PLD platform with less memory. The modification may involve reducing the size of memory buffers, or using a different memory controller in the design. Some other portions of the design, such as address/data bus widths, control logic, and pipeline stages, may also need be adjusted accordingly. These changes may be a burden to users, especially when they cannot be abstracted and automated.

Instead of storing application data in memory, some systems, such as hardware-in-the-loop (HITL) systems, dynamically stream data into the design running on a PLD. Although this approach overcomes the memory size limitation, it does not offer a good degree of abstraction and transparency to users. Users often need to consider the data streaming as part of the design by taking into account of the data transfer time, communication handshaking, data consumption pattern and timing. Therefore, dynamically streaming data changes the memory access model and requires modifications to the design.

Conventional software tools implementing hardware co-simulation support the concept of shared memory. A dual-port memory block is logically partitioned into two halves, where one half is accessed by the software application and the other half is accessed by the design running on the PLD. The software application manages the synchronization of the memory content in software and hardware by using a mutually exclusive locking mechanism. While the approach may be extended to overcome the memory size limitation by constantly updating the memory with new data, there are significant drawbacks with this approach. For example, one half of the dual memory block becomes unusable by the design. Also, the shared memory is not completely abstracted from the design. That is, users still need to interface the design with the shared memory appropriately, and use the control and locking correctly.

Accordingly, there is a need for an improved method of and system for implementing a circuit in a device having programmable logic.

SUMMARY

A method of implementing a circuit in a device having programmable logic and a predetermined amount of available internal memory is disclosed. The method comprises configuring the programmable logic of the device with a circuit design; storing data in a block of random access memory; implementing the circuit design, wherein implementing the circuit design requires more memory than the predetermined amount of available internal memory; performing a partial reconfiguration of the device, where new data is stored in the block of random access memory; and accessing the new data stored in the block of random access memory. The method may further comprise disabling a clock signal to the circuit design when performing the partial reconfiguration of the device and generating a command to perform the partial reconfiguration in response to detecting an error when accessing the block of random access memory.

According to an alternate embodiment, a method of implementing a circuit in a device having programmable logic and a predetermined amount of available internal memory comprises configuring the programmable logic of the device with a circuit design; storing a first page of data in a block of random access memory; determining a page fault while interfacing with the block of random access memory when implementing the circuit design; performing a partial reconfiguration of the device, where a second page of data is stored in the block of random access memory; and accessing the second page of data. The method may further comprise coupling a page fault signal to a write enable input of the block of random access memory after determining a page fault. Further, coupling an address from the circuit design to the memory comprises coupling a first portion of the address to the memory and a second portion of the address to a page index comparator.

A system for implementing a circuit in a device having programmable logic is also disclosed. The system comprises blocks of random access memory comprising a predetermined amount of available internal memory; a circuit design configured in programmable logic, wherein implementing the circuit design requires more memory that the predetermined amount of available internal memory; a communication interface coupled to access data external to the blocks of random access memory; and a memory management unit coupled to the communication interface, the memory management unit generating commands to enable a partial reconfiguration of the blocks of random access memory to enable implementing the circuit design. According to one embodiment, the memory management may comprise an arbitrator coupled to a plurality of page index registers.

DETAILED DESCRIPTION

Figure 1:
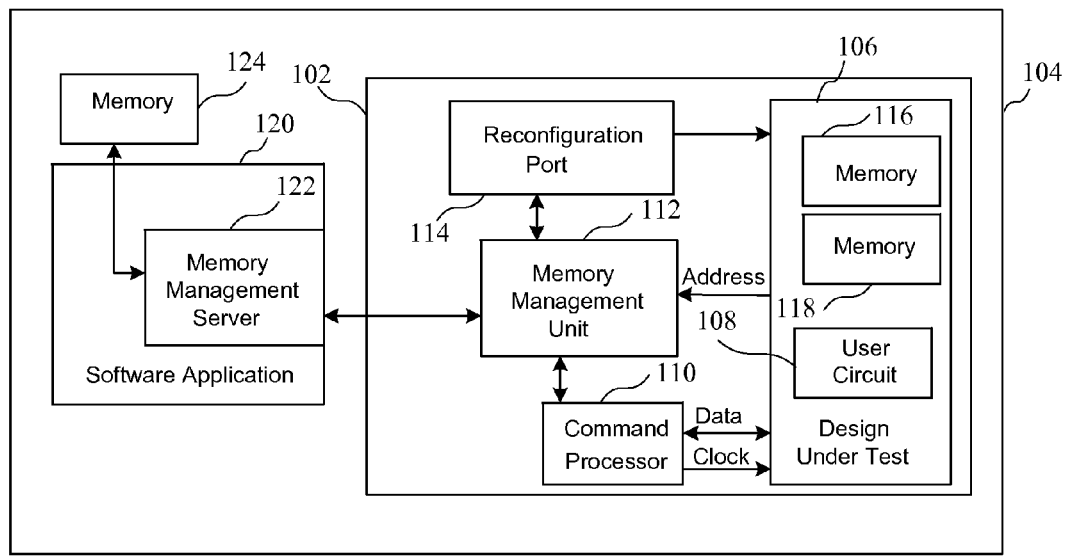
FIG. 1 is a block diagram of a system for implementing a circuit in a device having programmable logic according to an embodiment the present invention.

Turning first to FIG. 1, a block diagram of a system for implementing a circuit in a device having programmable logic according to an embodiment the present invention is shown. In particular, a device having programmable logic 102, which may comprise a PLD, on a system 104 comprises a design under test (DUT) 106 having a user circuit 108 implemented in programmable logic. A command processor 110 is coupled to the user circuit 108 and transmits data to and receives data from the design under test based upon a clock provided to the design under test. The data provided to the design under test may be co-simulation data or co-processing data as will be described in more detail below. The command processor 110 is also coupled to a memory management unit 112. The memory management unit 112 is also coupled to a reconfiguration port 114 for configuring one or more memories associated with the device under test, such as a memory 116 and a memory 118. The memories may comprise blocks of random access memories of a programmable logic device, which will be described in more detail in reference to FIG. 8. The memory management unit receives an address from the design under test, and communicates with an external application, such as a software application 120. The software application may comprises a memory management server 122 implemented by the software and coupled to a memory 124. The memory 124 may store data necessary to implement the user circuit 108, as will be described in more detail below. The memory management server 122 may comprise a portion of the software to enable the transfer of data from the memory 124 to the device 102 as required to operate the user circuit 108. The software application may be run on an integrated circuit separate from the device having programmable logic, both of which may be implemented on a circuit board, for example. For example, the software application 122 may run on a processor 120 comprising a separate integrated circuit from the memory 124 and the device 102, all of which may be incorporated on a system 104 comprising a circuit board.

Data and control signals are sent back and forth between the device 102 and the software application. The command processor acts as a proxy between the software application and the DUT 106. It interprets the commands from the software application and then interacts with the DUT accordingly. The memory management unit (MMU) is responsible for handling the content of memory 116 and memory 118. A reconfiguration port 114, comprising an internal configuration access port, is used to read and write the content of a memory block on the PLD, such as memory 116 or memory 118, at runtime. The reconfiguration port provides a simple solution to alter the memory content without adding extra multiplexing/demultiplexing logic to the memory block interface. The memory management server (MMS) of the software application handles requests for data issued by the MMU.

Figure 2:
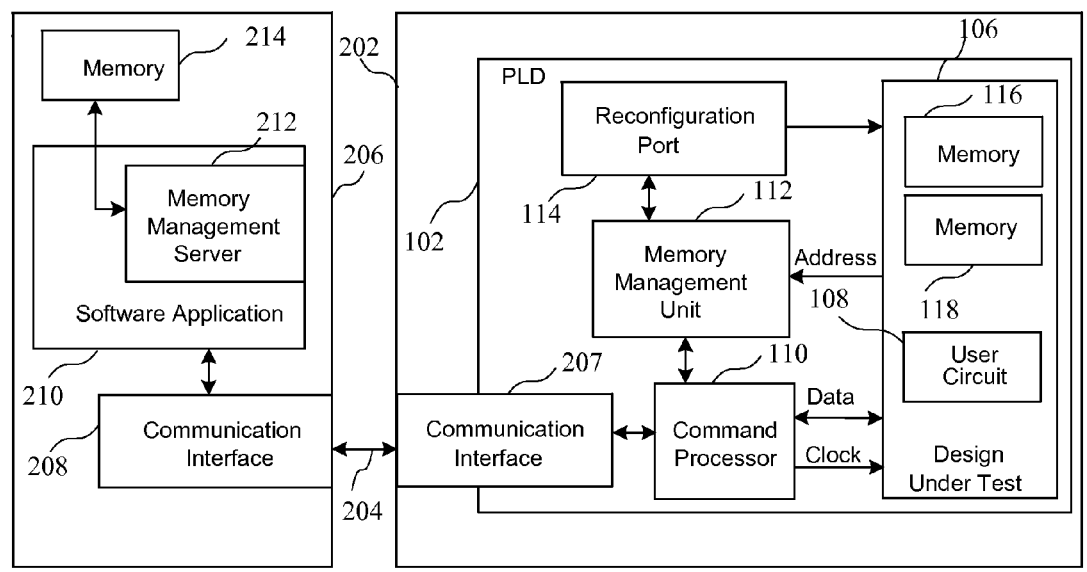
FIG. 2 is a block diagram of a system for implementing a circuit in a device having programmable logic according to an alternate embodiment the present invention.

Rather than the device 102 having programmable logic and the software application being incorporated on the same device of the system, the system of FIG. 2 may comprises a first circuit board 202 coupled by an interface 204 to a separate device 206 running a software application. The device 102 and the software application exchange data through the communication channel 204, where the data transmissions handled by communication interfaces. In particular, a communication interface 207 of the circuit board 202 communicates with a communication interface 208 of the device 206 by way of the interface 204. The interface 204 may comprise any type of data channel, including any type of wired or wireless interface, or any type of short range interface, such as a local area network, or long range interface, such as a wide area network. The interface may also be a dedicated interface, or a shared interface, such as an Ethernet connection. According to the embodiment of FIG. 2, a software application 210 having a portion of software comprising a memory management server 212 is adapted to provide data from a memory 214 by way of the communication interface 208.

According to one aspect of the systems of FIGS. 1 and 2, a virtual memory technique is used to virtually extend the addressable memory space of the device 102 over the size of the physical memory inside the system. This is achieved by exploiting the locality and temporal characteristics of memory access. As will be described in more detail in reference to FIG. 3, it also allows applications to perceive a consistent and contiguous view of the memory, independent of the addressing scheme of the physical memory. The virtual memory address is transparently translated into the physical memory address on a memory access, and the content is synchronized between the two memory spaces when needed. For example, a paged memory system may be used, in which the address space is partitioned into small segments called pages. The physical memory may correspond to some pages in the virtual memory at a particular time, while some or all pages in the virtual memory may reside on a secondary storage device. The secondary storage device may be any type of memory device or system having a memory device separate from and accessible by the device 102. When an application program requests to access a page that does not currently reside on the physical memory, a "page fault" signal is generated to interrupt the normal program flow. The requested page will be swapped in, and some other page may be swapped out, before the program resumes its execution. The page swapping process is carried out on demand, also known as demand paging, in a seamless and transparent fashion, as will be described in more detail in reference to FIGS. 3-5.

Figure 3:
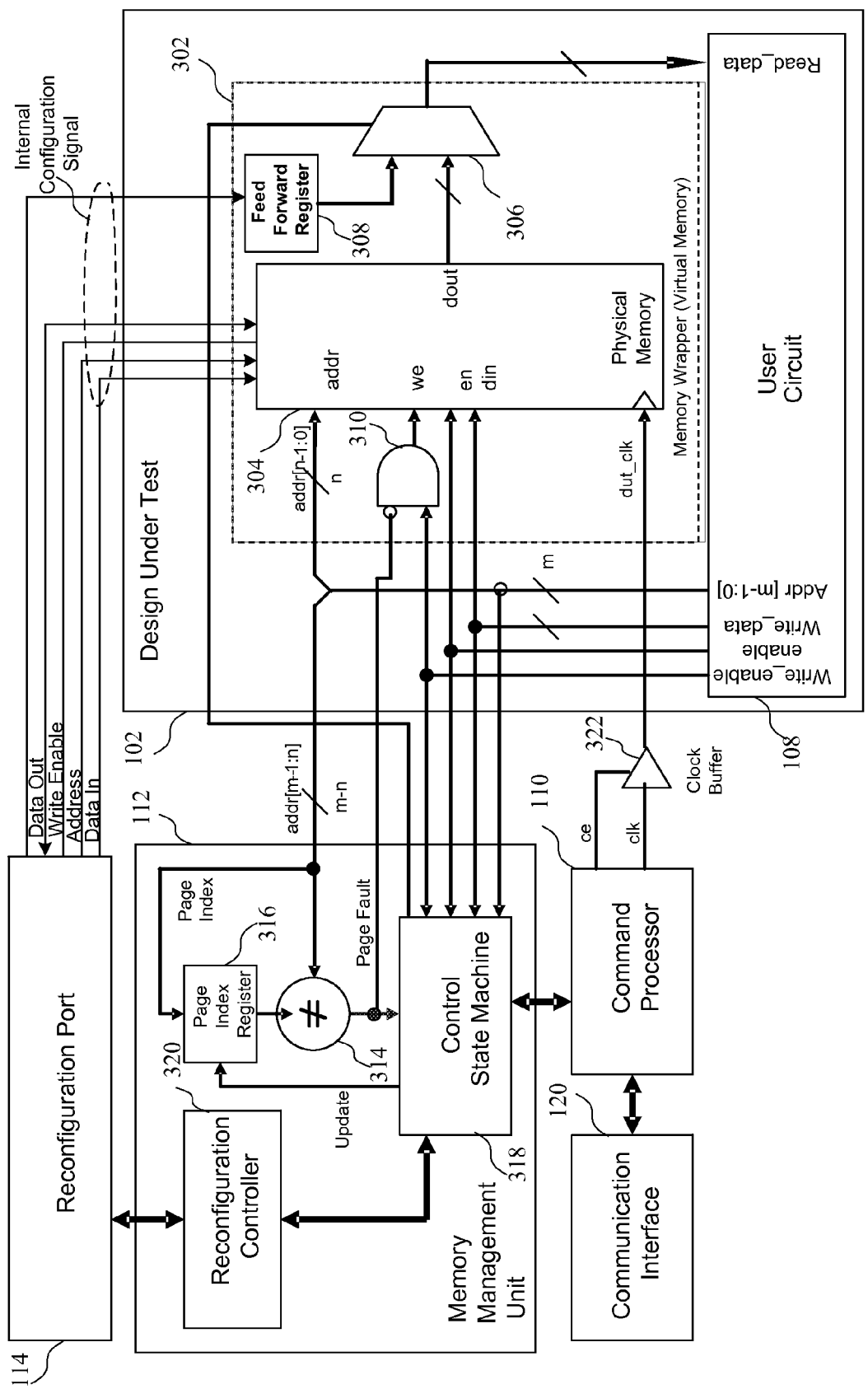
FIG. 3 is a block diagram of a device having a user circuit implemented in programmable logic according to an embodiment of the present invention.

Turning now to FIG. 3, a block diagram of a device having an integrated circuit implemented in programmable logic according to an embodiment of the present invention is shown. In particular, the design under test 102 has a memory wrapper 302 acting as a virtual memory having a physical memory 304, which may comprise, for example, the memory 116 or memory 118. The user circuit 108 comprises a circuit implemented in programmable logic and generates an address (addr[m-1:0]), and receives output data (Read_data) based upon a portion of the address addr[n-1:0] provided to the physical memory. The output of the memory 304 is coupled to a first input of a multiplexer 306, which is also coupled at a second input to a forward feed register 308. The implementation of the feed forward register 308 will be described in more detail in reference to FIG. 7.

An AND gate 310 receives a page fault signal at a first input and a write enable (we) signal at a second input, the output of which is coupled to a write enable input of the memory 304. The page fault signal is based upon the output of a comparator 314, which compares predetermined bits of an address received from the user circuit 108 to an address of a page index register 316. The control state machine 318 also receives the page fault signal, and receives the output of the reconfiguration controller 320 to generate an update to the page index register 316 associated with a new page to be loaded in the event of a page fault. The reconfiguration controller 320 is coupled to the control state machine 318 and the reconfiguration port 114 to enable reconfiguration of the physical memory. The address (addr), enable (en), and a data in (din) signal are also coupled to both the memory 304 and the memory management unit 112. Finally, the command processor 110 generates a clock enable (ce) signal and a clock (clk) signal for a clock buffer 322, the output of which is a device under test (dut_clk) clock which is used to clock the memory 304.

The page swapping process employing the circuit of FIG. 3 is transparent and does not impose any design modifications for users. The use of internal reconfiguration capability of the reconfiguration port 114, providing a write enable, an address and a data input signal by way of separate ports of the physical memory, allows the structure of the design and the memory interface to remain unchanged. The reconfiguration of the memory by way of the reconfiguration port may be implemented according to the same protocol for writing to the memory by way of the control state machine. During the development of the DUT, a user may decide an arbitrarily memory size for the design which is independent of the target PLD platform. The implementation of the virtual memory circuit preferably occurs automatically at the design compilation time. When the DUT is being compiled for a particular platform, any additional logic to enable page swapping will be inserted to form the final PLD implementation. For example, the logic may include a memory management unit and a memory wrapper, where the lower n bits of the address input are mapped to the address port of the physical memory on the PLD and the upper m-n bits are routed to the MMU for page fault generation by the comparator 314. Finally, the generation of meta information about the page size, the number of pages, and other details about the platforms, which may be used by the MMS to appropriately handle page requests, is automated. To simplify the address translation, the circuit of FIG. 3 may implement a single-page physical memory. If m bits are used for virtual memory addressing and n (n<m) bits are used for physical memory addressing, the address translation simply takes the lower n bits of a virtual address as the physical address, and the upper m-n bits as the page index. Accordingly, there are $2^{m-n}$ pages in the virtual memory and one page in the physical memory at a time.

Figure 4:
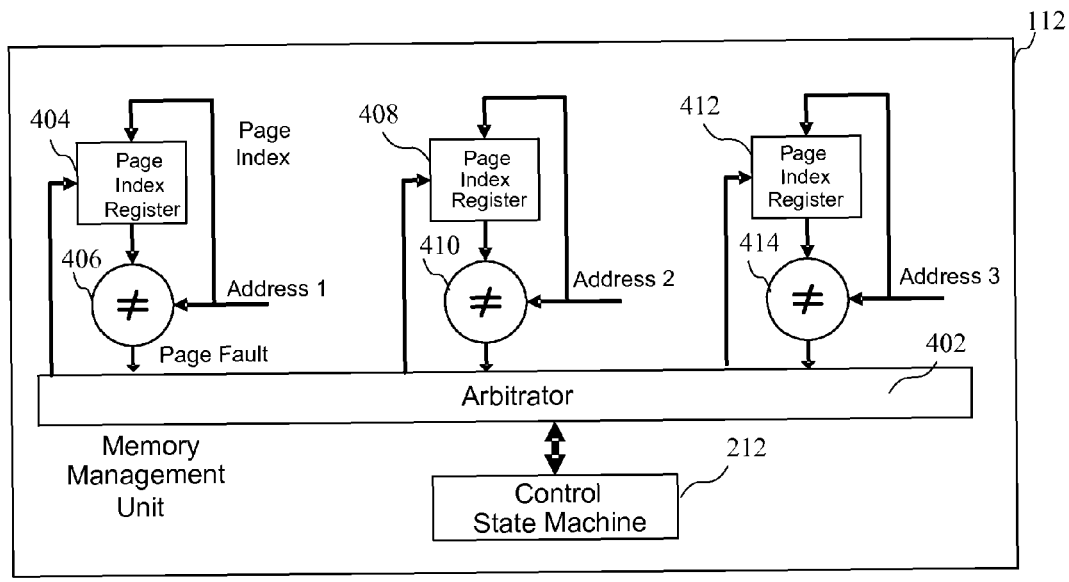
FIG. 4 is a block diagram of a portion of a memory management unit according to an embodiment of the present invention.

Turning now to FIG. 4, a block diagram of a memory management unit according to an embodiment of the present invention is shown. It is common that a design requires multiple independent memory units, such as multiple blocks of random access memories (BRAMs) described in reference to FIG. 8, and each forms an individual memory space. The MMU may be extended to support memory spaces by adding an arbitrator to coordinate multiple page fault events. If multiple page faults occur concurrently, the arbitrator schedules the page swapping processes sequentially or in an interleaving fashion. In particular, the memory management unit may comprise an arbitrator 402 coupled to a plurality of page index registers. That is, there may be a number of BRAMs which are associated with a circuit implemented in programmable logic. For example, a first page index register 404 may be coupled to a first comparator 406 which compares the value in the page index register with a first address, a second page index register 408 may be coupled to a second comparator 410 which compares the value in the page index register with a second address, and a third page index register 412 may be coupled to a third comparator 414 which compares the value in the page index register with a third address. If multiple page faults occur concurrently, the arbitrator schedules the page swapping processes sequentially or in an interleaving fashion.

Every memory access in the DUT is filtered by the MMU simultaneously. The page index portion comprising the upper m-n bits of the requested virtual memory address is compared with the value of the page index register. A mismatch in these two values indicates the requested memory location is not currently in the physical memory. In such a case, a page fault is generated and activates the control state machine to perform the paging swapping process. In particular, the DUT clock is disabled through the command processor, and the current page is swapped out from the physical memory. The content of the current page is read through the reconfiguration port and then transferred back to the host. The current page in the PLD is preferably provided to the host to ensure that the host has an updated version of the current page. The requested page is then swapped into the physical memory. That is, the content of the requested page is read from the host, and then loaded into the physical memory through the reconfiguration port. After the page register in the MMU is updated to signal the completion of page swapping, the DUT clock is again enabled to resume the execution of the design, as will be described in more detail in reference to FIGS. 6 and 7.

In absence of page faults, there is no or minimal communication between the PLD and the MMS. The MMS passively waits for page requests from the MMU. When a page fault occurs, the MMU issues a page request to the MMS to initiate a page swapping process. The request includes the page content being swapped out and the index of the requested page. The MMS saves the swapped-out page to its memory, and then sends back the requested page to the MMU. In order to provide a seamless and transparent paging swapping, the memory write and read operations are handled specially, as will be described in more detail below in reference to FIGS. 6 and 7. It is important to note that the circuit of FIG. 4 does not impose any modifications to the control or timing of memory access in the user design. Accordingly, all the memory read and write operations happen as if no page swapping occurs.

Figure 5:
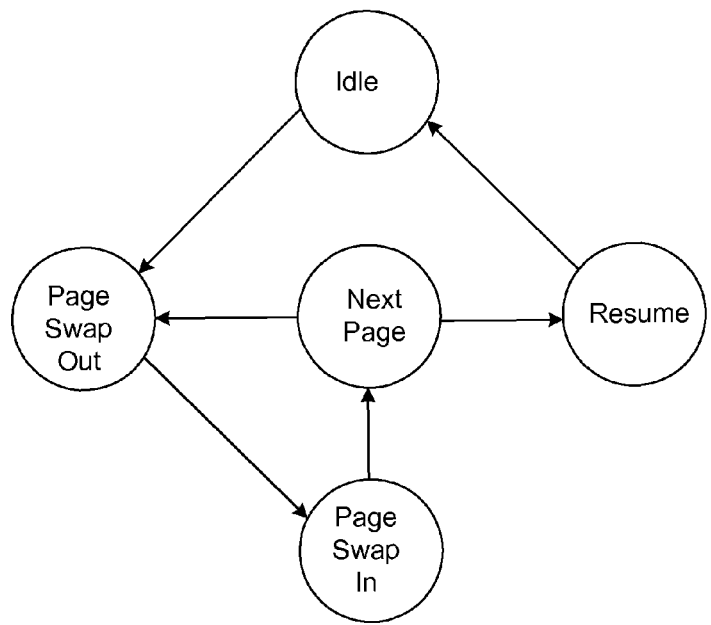
FIG. 5 is a state diagram showing the operation of the control state machine of the memory management unit of FIG. 4 according to an embodiment of the present invention.

Turning now to FIG. 5, a state diagram shows the operation of the control state machine of the memory management unit of FIG. 4 according to an embodiment of the present invention. The control state machine (CSM) is initially at the IDLE state. The address of a memory access is constantly compared against the value stored in each page index register to determine whether the access falls outside of a current page. A page fault signal is generated when the memory access is outside of a current page. The arbitrator monitors all the page fault signals, selects one of them at a time, and forwards the page fault event to the CSM. The arbitrator may be implemented as a priority encoder circuit. The CSM, upon receiving a page fault event, instructs the command processor to stop the clock of the DUT and transitions from the IDLE state to the Page-Swap-Out state. During the Page-Swap-Out state, the CSM instructs the reconfiguration controller to read the content of the memory being swapped out. The CSM also instructs the command processor to send the content to the host in order to update the host with the most current version of the page. After current memory content is swapped out, the CSM transitions to the Page-Swap-In state. During Page-Swap-In state, the CSM receives the new memory content being swapped in from the host. The CSM also instructs the reconfiguration controller to load the content into the memory and then updates the page index register to indicate the new page that is swapped in. After the new memory content is swapped in, the CSM transitions to the Next-Page state where it queries the arbitrator for further pending page fault events. If there is any pending page fault event, the CSM transitions to the Page-Swap-Out state and repeats the page swapping process. Otherwise, the CSM transitions to the Resume state. At the Resume state, the CSM instructs the command processor to reactivate the clock of the DUT. The CSM finally goes back to the Idle state and waits for page fault events again.

Figure 6:
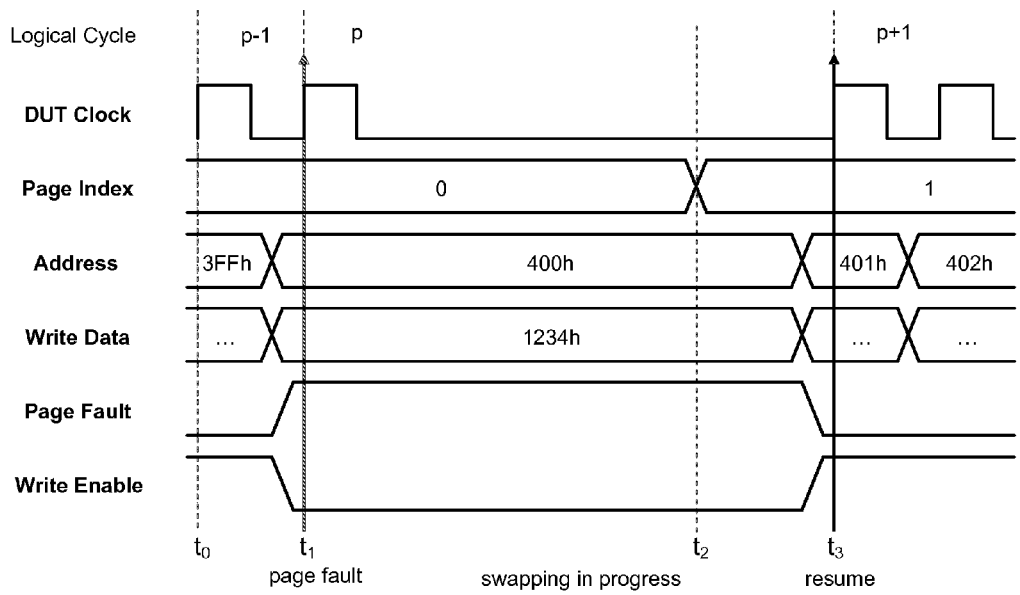
FIG. 6 is a timing diagram showing a write operation by the memory management unit according to an embodiment of the present invention.
Figure 7:
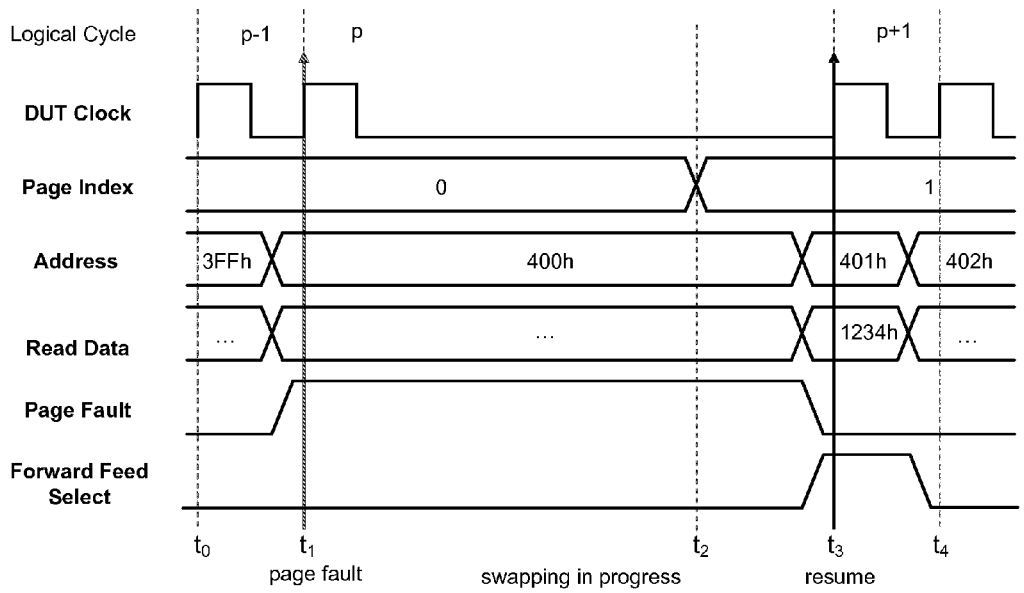
FIG. 7 is a timing diagram showing a read operation by the memory management unit according to an embodiment of the present invention.

Turning now to FIGS. 6 and 7, timing diagrams show both write and read operations by the memory management unit. When a page fault occurs on a memory write, the write enable signal to the physical memory is disabled to prevent memory corruption to the current page. After the requested page is swapped in, the actual write operation is performed through the reconfiguration port instead of the physical memory interface. This allows a seamless transition to the next DUT clock cycle. As shown in FIG. 6, during a logical cycle p−1, a page fault occurs, after which the DUT clock is disabled during the logical cycle p. That is, at clock cycle p at a time $t_1$, a memory write request to address 400*h* is issued. Because the address 400*h* is not an address associated with page 0, a page fault occurs. The write enabled is then brought low in response to the page fault, preventing the data word 1234*h* from being written into address 400*h*. The memory management unit swaps out page 0 to the host and brings page 1 into the physical memory at a time $t_2$. The host is preferably updated with the most recent version of page 0 stored in the physical memory. Accordingly, if the content of page 0 had been changed by the user circuit, the most current version of page 0 is provided to the host. The host updates memory location 400*h* with the data word 1234*h* during the process to mimic the memory write that was disabled at cycle p. Although the DUT clock is disabled, the data in the physical memory 304 is updated with page 1 by way of the reconfiguration port 114. However, the latest version of page 1 resides at the host. But since the memory write to 400*h* occurs on the PLD at the moment of page fault, the write is not (and cannot be) performed because page 1 is not yet in the physical memory. The host needs to "redo" the memory write before resuming the DUT clock by letting the host directly update the page 1 content before sending it to the PLD. Alternatively, the memory write may be done by the memory management unit during the same process of partial reconfiguring the physical memory. When the DUT clock is resumed at a time $t_3$ after the page swapping process is complete, the DUT is exercised again at the logical cycle p+1.

When a page fault occurs on a memory read as shown in FIG. 7, the data being read out from the physical memory is not the expected content and thus discarded. If a read request occurs at a cycle p in response to a read request at address 400*h*, a page fault also occurs at a time $t_1$. After the requested page is swapped in at a time $t_2$, the MMU loads the expected data into a feed-forward register through the reconfiguration port and is used in the next DUT clock cycle. However, when the DUT clock is resumed after the page swapping process completes, the DUT is exercised again at the logical cycle p+1 at a time $t_3$, where the data is read from the feed forward memory rather than the physical memory. That is, because the data in the physical memory may not be accessed for one clock cycle after the page is updated, the feed forward select signal coupled to multiplexer 306 enables reading the data in the feed forward register for one clock cycle, after which data is read out of the physical memory at a time $t_4$.

Figure 8:
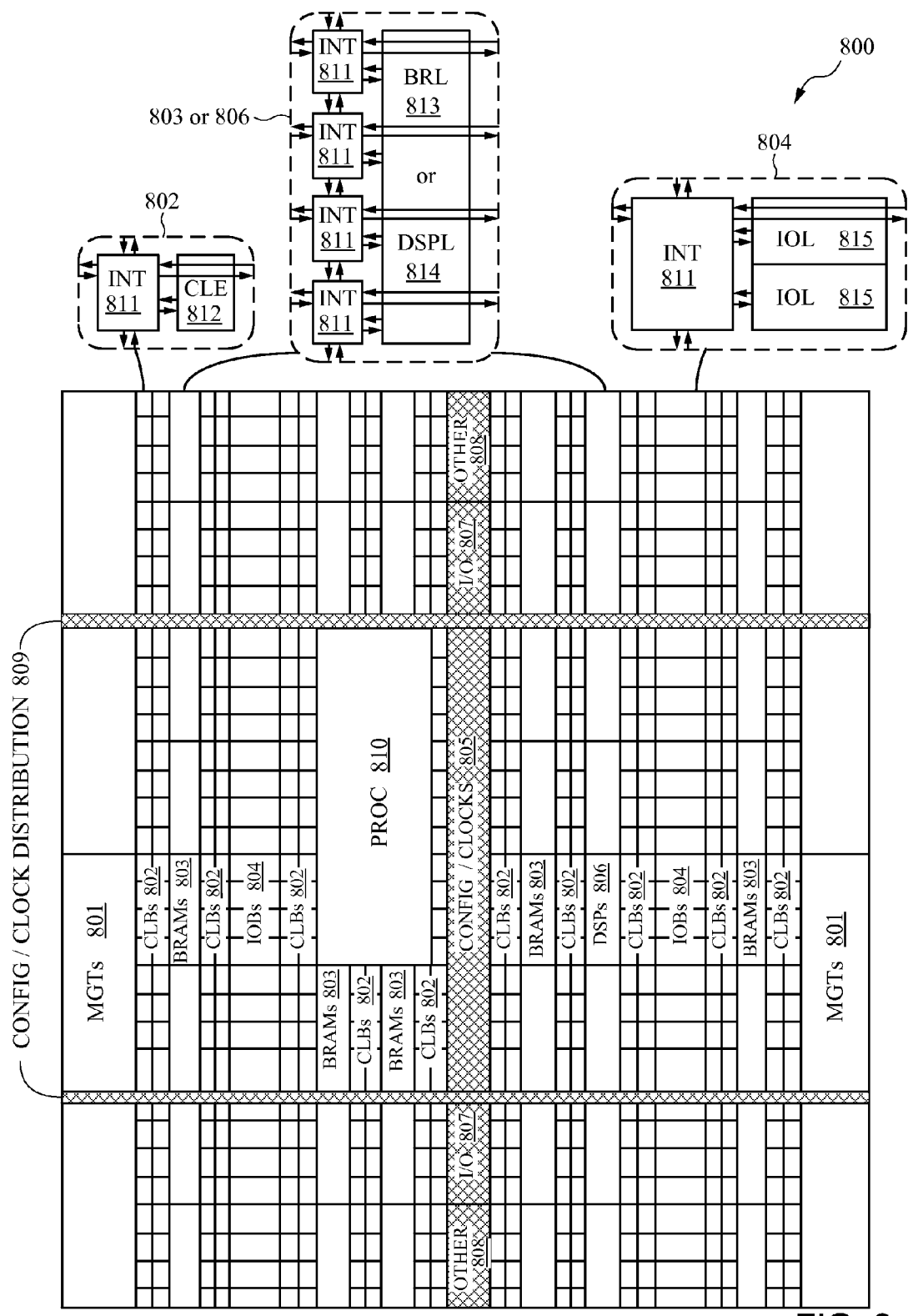
FIG. 8 is a block diagram of a programmable logic device according to an embodiment of the present invention.

Turning now to FIG. 8, a block diagram of a programmable logic device according to an embodiment of the present invention is shown. Advanced FPGAs may include several different types of programmable logic blocks in the array. For example, FIG. 8 illustrates an FPGA architecture that includes a large number of different programmable tiles comprising programmable logic including multi-gigabit transceivers (MGTs 801), configurable logic blocks (CLBs 802), random access memory blocks (BRAMs 803), input/output blocks (IOBs 804), configuration and clocking logic (CONFIG/CLOCKS 805), digital signal processing blocks (DSPs 806), specialized input/output blocks (I/O 807) (e.g., configuration ports and clock ports), and other programmable logic 808 such as digital clock managers, analog-to-digital converters, system monitoring logic, and so forth. Some FPGAs also include dedicated processor blocks (PROC 810).

In some FPGAs, each programmable tile includes a programmable interconnect element (INT 811) having standardized connections to and from a corresponding interconnect element in each adjacent tile. Therefore, the programmable interconnect elements taken together implement the programmable interconnect structure for the illustrated FPGA. The programmable interconnect element (INT 811) also includes the connections to and from the programmable logic element within the same tile, as shown by the examples included at the top of FIG. 8.

For example, a CLB 802 may include a configurable logic element (CLE 812) that may be programmed to implement user logic plus a single programmable interconnect element (INT 811). A BRAM 803 may include a BRAM logic element (BRL 813) in addition to one or more programmable interconnect elements. Typically, the number of interconnect elements included in a tile depends on the height of the tile. In the pictured embodiment, a BRAM tile has the same height as five CLBs, but other numbers (e.g., four) may also be used. A DSP tile 806 may include a DSP logic element (DSPL 814) in addition to an appropriate number of programmable interconnect elements. An IOB 804 may include, for example, two instances of an input/output logic element (IOL 815) in addition to one instance of the programmable interconnect element (INT 811). As will be clear to those of skill in the art, the actual I/O pads connected, for example, to the I/O logic element 815 typically are not confined to the area of the input/output logic element 815.

In the pictured embodiment, a columnar area near the center of the die (shown shaded in FIG. 8) is used for configuration, clock, and other control logic. Horizontal areas 809 extending from this column are used to distribute the clocks and configuration signals across the breadth of the FPGA.

Some FPGAs utilizing the architecture illustrated in FIG. 8 include additional logic blocks that disrupt the regular columnar structure making up a large part of the FPGA. The additional logic blocks may be programmable blocks and/or dedicated logic. For example, the processor block PROC 810 shown in FIG. 8 spans several columns of CLBs and BRAMs.

Note that FIG. 8 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 8 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

Figure 9:
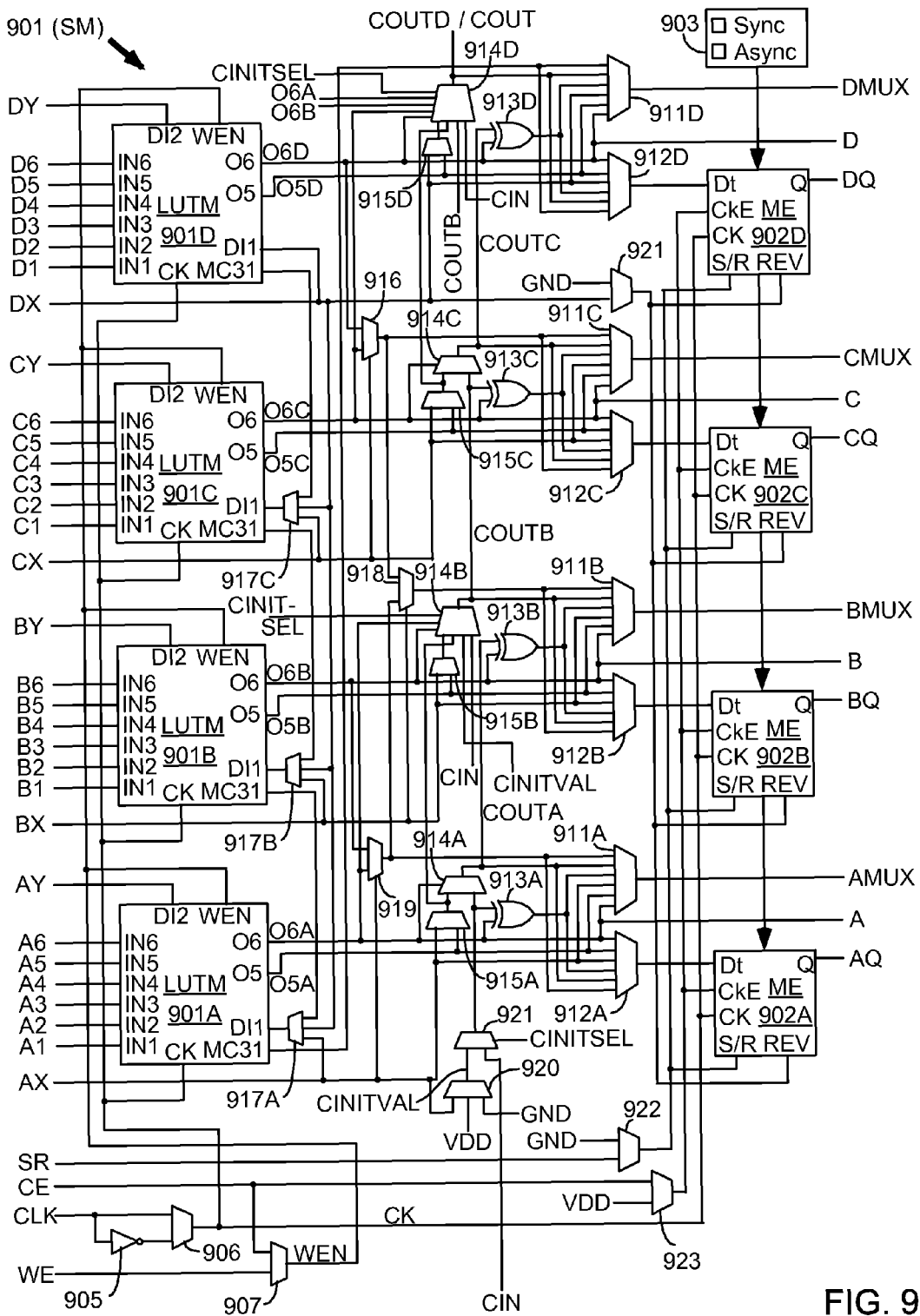
FIG. 9 is a block diagram of a configuration logic element according to an embodiment of the present invention.

Turning now to FIG. 9, a block diagram of a configurable logic element of the programmable logic device of FIG. 8 according to an embodiment of the present invention is shown. In particular, FIG. 9 illustrates in simplified form a configurable logic element of a configuration logic block 802 of FIG. 8. In the embodiment of FIG. 9, slice M 900 includes four lookup tables (LUTMs) 901A-901D, each driven by six LUT data input terminals A1-A6, B1-B6, C1-C6, and D1-D6 and each providing two LUT output signals O5 and O6. The O6 output terminals from LUTs 901A-901D drive slice output terminals A-D, respectively. The LUT data input signals are supplied by the FPGA interconnect structure via input multiplexers, which may be implemented by programmable interconnect element 911, and the LUT output signals are also supplied to the interconnect structure. Slice M also includes: output select multiplexers 911A-911D driving output terminals AMUX-DMUX; multiplexers 912A-912D driving the data input terminals of memory elements 902A-902D; combinational multiplexers 916, 918, and 919; bounce multiplexer circuits 922-923; a circuit represented by inverter 905 and multiplexer 906 (which together provide an optional inversion on the input clock path); and carry logic comprising multiplexers 914A-914D, 915A-915D, 920-921 and exclusive OR gates 913A-913D. All of these elements are coupled together as shown in FIG. 9. Where select inputs are not shown for the multiplexers illustrated in FIG. 9, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 9 for clarity, as well as from other selected figures herein.

In the pictured embodiment, each memory element 902A-902D may be programmed to function as a synchronous or asynchronous flip-flop or latch. The selection between synchronous and asynchronous functionality is made for all four memory elements in a slice by programming Sync/Asynch selection circuit 903. When a memory element is programmed so that the S/R (set/reset) input signal provides a set function, the REV input terminal provides the reset function. When the memory element is programmed so that the S/R input signal provides a reset function, the REV input terminal provides the set function. Memory elements 902A-902D are clocked by a clock signal CK, which may be provided by a global clock network or by the interconnect structure, for example. Such programmable memory elements are well known in the art of FPGA design. Each memory element 902A-902D provides a registered output signal AQ-DQ to the interconnect structure. Because each LUT 901A-901D provides two output signals, O5 and O6, the LUT may be configured to function as two 5-input LUTs with five shared input signals (IN1-IN5), or as one 6-input LUT having input signals IN1-IN6.

In the embodiment of FIG. 9, each LUTM 901A-901D may function in any of several modes. When in lookup table mode, each LUT has six data input signals IN1-1N6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 917A-917C for LUTs 901A-901C), or to the two 32-bit RAMs via input terminals DI1 and DI2. RAM write operations in the LUT RAMs are controlled by clock signal CK from multiplexer 906 and by write enable signal WEN from multiplexer 907, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 901A, for example, may also be provided to the general interconnect structure for shift register chaining, via output select multiplexer 911D and CLE output terminal DMUX. The circuits of FIGS. 1-5 may be implemented using the circuit of FIGS. 8 and 9, for example, or other suitable circuits.

Figure 10:
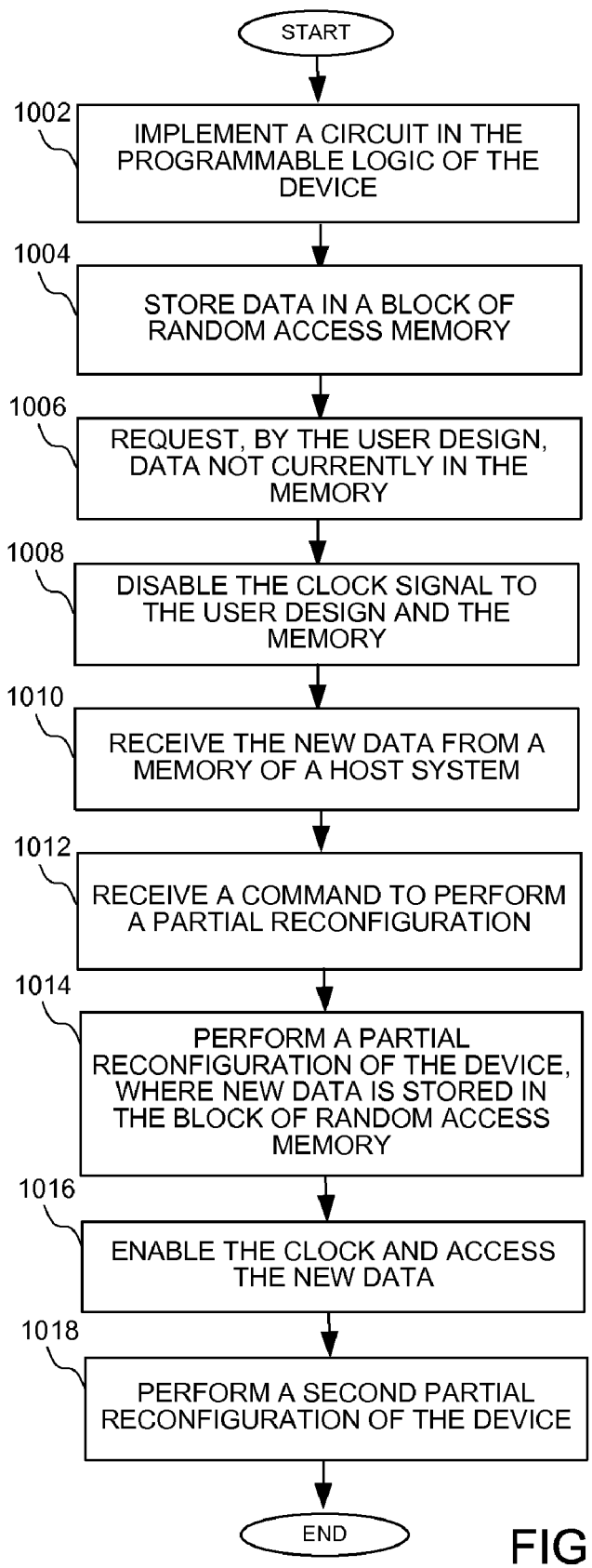
FIG. 10 is a flow chart showing a method of implementing a circuit in a device having programmable logic according to an embodiment the present invention.

Turning now to FIG. 10, a flow chart shows a method of implementing a circuit in a device having programmable logic according to an embodiment the present invention. In particular, a circuit is implemented in the programmable logic of a device at a step 1002. Data is stored in a block of random access memory at a step1004. Data not currently in the memory is requested by the user design at a step 1006. The clock signal to the user design and the memory is disabled at a step 1008. Data requested from the host memory system is received at a step 1010. A command to perform a partial reconfiguration is received at a step 1012. A partial reconfiguration of the device is performed at a step 1014, where new data is stored in the block of random access memory. The clock is enabled and new data is accessed at a step 1016. A second partial reconfiguration of the device is performed at a step 1018. That is, additional partial reconfigurations may be performed as often as necessary to load data required to implement the circuit design. The method of FIG. 8 may be implemented using any of the circuits or systems of FIGS. 1-7 as described above or any other suitable circuit.

An example of potential application of the circuits and systems described herein is a hardware-in-the-loop co-simulation supported in Xilinx System Generator for DSP (SysGen) and AccelDSP, both available from Xilinx, Inc. of San Jose, Calif. SysGen and AccelDSP are high-level system design tools that integrate the hardware co-simulation capability into a simulation and modeling environment. During hardware co-simulation, the simulation of a DUT is offloaded to hardware. The host simulation environment transmits stimuli to the input ports of the design running on hardware via a communication interface. Similarly, results are captured from the output ports of the design and then read back to the host. SysGen and AccelDSP provides the automation by combining the DUT with appropriate co-simulation and communication interface, generating a hardware implementation of the circuit, and coordinating the co-simulation between software and hardware environment. The clocking machinery to control whether the DUT is running in single-stepping or free-running clock is also provided, in order to fulfill both design verification and simulation acceleration requirements. In addition to providing co-simulating capabilities, the methods and circuits of the present invention also provide co-processing capabilities.

By way of example, in developing a processing filter for video applications, it is typical to use a hardware-in-the-loop system as an on-chip testing and accelerated simulation platform to verify that the filter is functioning. The test system may be set up to stream a sequence of video frames from the host to the filter running on a PLD, and the processed frames are read back to the host for verification. A common setup is to use the on-chip memory as frame buffers to hold the input and output frames for the filter. For the purpose of testing, it is necessary to sweep through a range of video frame sizes, e.g. from 320×240 video frame size commonly used with a WebCam to 1280×720 video frame size commonly used with high definition television (HDTV) frames. At certain frame sizes, there is not enough memory on the PLD to hold an entire frame. To enable rapid prototyping, it is not desirable to redesign the test system to accommodate large frames. By implementing the circuits and methods of Applicants' invention, all the test video frames may be stored linearly in a large virtual memory. Although only some portion of a frame may be physically stored in the on-chip memory, the test system may operate as if it is accessing the entire virtual address space. Therefore, it simply steps through the memory locations sequentially to read and write frames. While a specific example of a processing filter for video applications is described, the circuit and methods may be used in a variety of applications.

It can therefore be appreciated that the new and novel method of and system for implementing a circuit in a device having programmable logic has been described. It will be appreciated by those skilled in the art that numerous alternatives and equivalents will be seen to exist which incorporate the disclosed invention. As a result, the invention is not to be limited by the foregoing embodiments, but only by the following claims.

What is claimed is:

1. A method of implementing a circuit in a device having programmable resources and a predetermined amount of available internal memory, the method comprising:
configuring the programmable resources of the device with a circuit design;
storing a first page of data in a block of random access memory;
wherein the first page of data comprises a segment of a partitioned address space;
determining a page fault while interfacing with the block of random access memory when implementing the circuit design, wherein the page fault indicates a request to access a page of data that does not reside on the block of random access memory;
performing a partial reconfiguration of the device, wherein a second page of data is stored in the block of random access memory; wherein the second page of data comprises another segment of another partitioned address space; and
accessing the second page of data.

2. The method of claim 1 further comprising coupling a page fault signal to a write enable input of the block of random access memory after determining a page fault.

3. The method of claim 1 further comprising coupling an address from the circuit design to the block of random access memory.

4. The method of claim 3 wherein coupling an address from the circuit design to the block of random access memory comprises coupling a first portion of the address to the block of random access memory and a second portion of the address to a page index comparator.

5. The method of claim 1 further comprising selecting the content of a feed forward register after a page fault is detected when reading data from the block of random access memory.

6. The method of claim 1 wherein performing a partial reconfiguration comprises reconfiguring data in the block of random access memory by way of a reconfiguration port.

7. The method of claim 1 further comprising disabling the clock signal to the block of random access memory when performing a partial reconfiguration of the device.

8. A system for implementing a circuit in a device having programmable resources and a predetermined amount of available internal memory, the system comprising:

means for configuring the programmable resources of the device with a circuit design;

means for storing a first page of data in a block of random access memory;

means for determining a page fault while interfacing with the block of random access memory when implementing the circuit design;

means for performing a partial reconfiguration of the device, wherein a second page of data is stored in the block of random access memory; and means for accessing the second page of data.

* * * * *